(12) United States Patent
Sato et al.

(10) Patent No.: US 8,159,880 B2
(45) Date of Patent: Apr. 17, 2012

(54) NAND FLASH MEMORY

(75) Inventors: Atsuhiro Sato, Tokyo (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/164,486

(22) Filed: Jun. 20, 2011

(65) Prior Publication Data

US 2011/0249493 A1 Oct. 13, 2011

Related U.S. Application Data (62) Division of application No. 12/564,598, filed on Sep. 22, 2009, now Pat. No. 7,983,086.

(30) Foreign Application Priority Data

Oct. 10, 2008 (JP) ................................ 2008-263562

(51) Int. Cl.
*G11C 16/00* (2006.01)

(52) U.S. Cl. .......... 365/185.17; 365/185.03; 365/185.24

(58) Field of Classification Search ........................ None
See application file for complete search history.

(56) References Cited

U.S. PATENT DOCUMENTS

| | | | |
|---|---|---|---|
| 5,163,021 A * | 11/1992 | Mehrotra et al. | ........ 365/185.03 |
| 5,894,435 A | 4/1999 | Nobukata | |
| 6,011,287 A | 1/2000 | Itoh et al. | |
| 6,055,181 A * | 4/2000 | Tanaka et al. | ............ 365/185.03 |
| 6,061,270 A | 5/2000 | Choi | |
| 6,154,391 A | 11/2000 | Takeuchi et al. | |
| 6,208,573 B1 | 3/2001 | Tanaka et al. | |
| 6,344,996 B2 | 2/2002 | Tanaka et al. | |
| 6,859,397 B2 | 2/2005 | Lutze et al. | |
| 6,930,921 B2 | 8/2005 | Matsunaga et al. | |
| 7,120,051 B2 * | 10/2006 | Gorobets et al. | ......... 365/185.02 |
| 7,388,778 B2 * | 6/2008 | Hwang | .................... 365/185.03 |
| 7,443,734 B2 | 10/2008 | Shibata | |
| 7,593,259 B2 * | 9/2009 | Kim | ........................ 365/185.03 |
| 2007/0159881 A1 | 7/2007 | Sato et al. | |
| 2007/0177431 A1 | 8/2007 | Matsunaga et al. | |
| 2009/0129158 A1 | 5/2009 | Sato et al. | |

FOREIGN PATENT DOCUMENTS

| | | |
|---|---|---|
| JP | 10-283788 | 10/1998 |
| JP | 2007-87513 | 4/2007 |

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

In a state in which a first and second selection gate transistors are turned off and a first voltage is applied to a control gate of a second memory cell transistor which is connected to a source line side of a first memory cell transistor selected from among the memory cell transistors and which is to be cut off, a second voltage which is higher than the first voltage and which causes a plurality of third memory cell transistors remaining unselected in the memory cell transistors to conduct is applied to control gates of the third memory cell transistors, and thereafter a threshold voltage of the first memory cell transistor is changed to a threshold voltage higher than the first threshold voltage corresponding to the erase state by applying a third voltage which is higher than the second voltage to a control gate of the first memory cell transistor.

5 Claims, 12 Drawing Sheets

WHEN CHANNEL POTENTIAL HAS RISEN TO SAME DEGREE, CUTOFF OCCURS. CHANNEL POTENTIAL ON BL SIDE RISES AS COMPARED WITH CONVENTIONAL ART.

NAND FLASH MEMORY

CROSS-REFERENCE TO RELATED APPLICATION

This application is a division of and claims the benefit of priority under 35 U.S.C. §120 from U.S. Ser. No. 12/564,598 filed Sep. 22, 2009, now U.S. Pat No. 7,983,086, and claims the benefit of priority under 35 U.S.C. §119 from Japanese Patent Application No. 2008-263562 filed Oct. 10, 2008, the entire contents of each of which are incorporated herein by reference.

BACKGROUND OF THE INVENTION

1. Field of the Invention

The present invention relates to a NAND flash memory using a programming scheme in which programming is conducted successively from a memory cell transistor on the source side.

2. Background Art

When boosting a channel in a memory cell transistor inhibited in programming in a NAND memory cell unit, the channel is more boosted if threshold voltages of memory cell transistors connecting to unselected word lines are in the erase state, especially in a deep erase state.

For example, the EASB programming scheme is proposed as a channel voltage control scheme at the time when programming is inhibited (see, for example, Japanese Patent Laid-Open No. 10-283788). For example, the REASB programming scheme is proposed as another example (see, for example, Japanese Patent Laid-Open No. 2007-87513).

In the EASB programming scheme and the REASB write scheme, sequential programming in which programming is conducted in order from a memory cell transistor on the source line side is premised.

In write operation according to the EASB programming scheme and the REASB programming scheme, a low voltage (for example, 0 V) is supplied to a word line of a memory cell transistor adjacent to the source side of the selected memory cell transistor or located on the source line side to cut it off.

And a write voltage Vpgm is applied to the word line of the selected memory cell transistor, and an intermediate voltage Vpass is applied to unselected word lines other than the word line of the selected memory cell transistor.

In this case, the boosted region is restricted to the selected memory cell transistor and memory cell transistors located on the bit line side as compared with the selected memory cell transistor. And all of these memory cell transistors in the boosted region are brought into the erase state by the sequential programming already described, and a high channel voltage is obtained.

It is attempted to prevent false programming into the memory cell transistor inhibited in programming, by using the EASB and REASB write schemes.

SUMMARY OF THE INVENTION

According to one aspect of the present invention, there is provided: a NAND flash memory using a write scheme in which writing is conducted sequentially beginning with a memory cell transistor on a source side, the NAND flash memory comprising:

a first selection gate transistor comprising a first end connected to a source line;

a second selection gate transistor comprising a first end connected to a bit line; and a plurality of memory cell transistors connected in series between a second end of the first selection gate transistor and a second end of the second selection gate transistor, data being able to be written into each of the memory cell transistors by applying a voltage to a control gate thereof, controlling a charge quantity of a floating gate thereof, and changing a threshold voltage, and in an erase state each of the memory cell transistors being set equal to a first threshold voltage being the lowest threshold voltage, wherein at time of write operation using the write scheme, in a state in which the first selection gate transistor and the second selection gate transistor are turned off and a first voltage is applied to a control gate of a second memory cell transistor which is connected to a source line side of a first memory cell transistor selected from among the memory cell transistors and which is to be cut off, a second voltage which is higher than the first voltage and which causes a plurality of third memory cell transistors remaining unselected in the memory cell transistors to conduct is applied to control gates of the third memory cell transistors, and thereafter a threshold voltage of the first memory cell transistor is changed to a threshold voltage higher than the first threshold voltage corresponding to the erase state by applying a third voltage which is higher than the second voltage and which is used to conduct writing into the first memory cell transistor to a control gate of the first memory cell transistor.

According to another aspect of the present invention, there is provided: a NAND flash memory using a write scheme in which writing is conducted sequentially beginning with a memory cell transistor on a source side, the NAND flash memory comprising:

a first selection gate transistor comprising a first end connected to a source line;

a second selection gate transistor comprising a first end connected to a bit line; and a plurality of memory cell transistors connected in series between a second end of the first selection gate transistor and a second end of the second selection gate transistor, data being able to be written into each of the memory cell transistors by applying a voltage to a control gate thereof, controlling a charge quantity of a floating gate thereof, and changing a threshold voltage, and in an erase state each of the memory cell transistors being set equal to a first threshold voltage being the lowest threshold voltage, wherein the data are assigned to threshold voltages which are higher than the first threshold voltage corresponding to the erase state, N+1 threshold voltages can be set for the memory cell transistors, N data are assigned to N threshold voltages other than the first threshold voltage corresponding to the erase state, and a first writing is conducted, as regards a threshold voltage of one memory cell transistor included in the memory cell transistors, by setting one data of two-valued data to a second threshold voltage which is lower next to the first threshold voltage corresponding to the erase state and setting the other data of the two-valued data to a third threshold voltage which is higher than the second threshold voltage.

DETAILED DESCRIPTION

COMPARATIVE EXAMPLE

Figure 1:
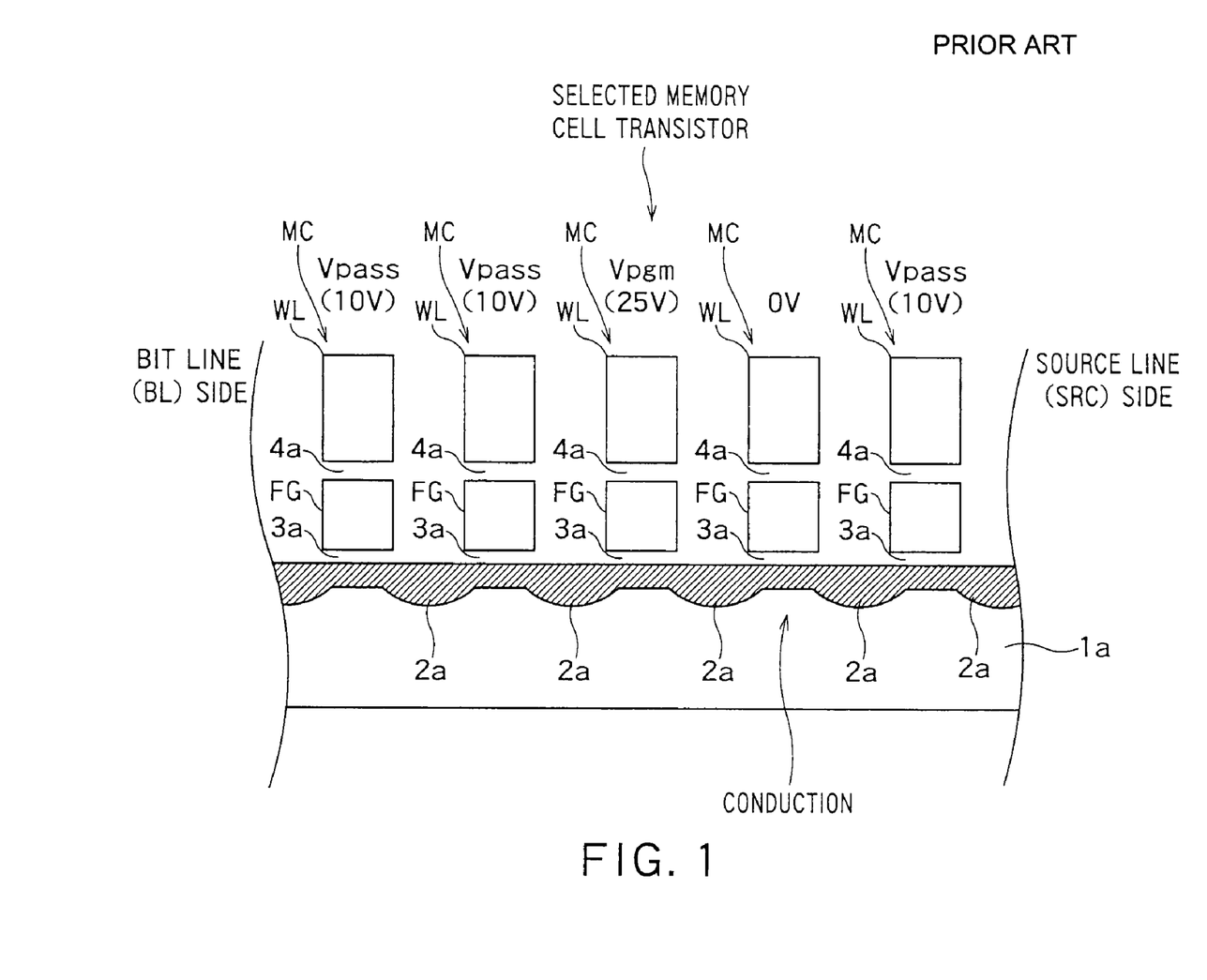
FIG. 1 is a sectional view showing a section of a NAND cell unit in a conventional NAND flash memory which serves as a comparative example.

FIG. 1 is a sectional view showing a section of a NAND cell unit in a conventional NAND flash memory as a comparative example.

In FIG. 1, the left side is a bit line BL side and the right side is a source line SRC side. This NAND cell unit includes a memory cell column formed of a plurality of memory cell transistors MC connected in series and selection gate transistors (not illustrated) respectively connected to both sides of the memory cell column.

Each of the memory cell transistors MC includes a diffusion layer 2a formed in a semiconductor substrate 1a, a floating gate FG formed over the semiconductor substrate 1a via a tunnel insulation film 3a, and a control gate (a word line WL) formed over the floating gate FG via an insulation film 4a.

A bit line BL is connected to the memory cell column via a selection gate transistor on the bit line side. A source line SRC is connected to the memory cell column via a selection gate transistor on the source line side.

Figure 2:
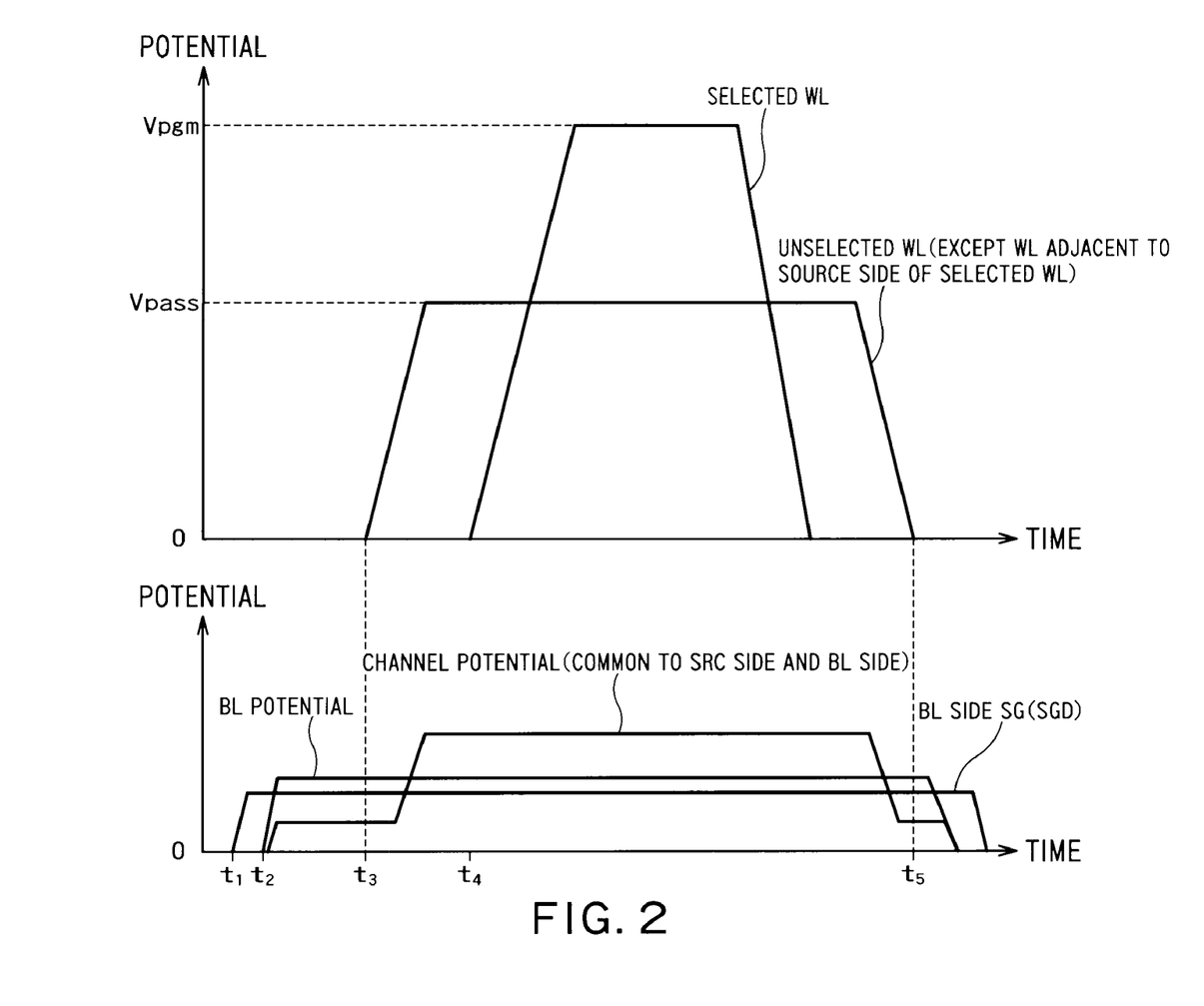
FIG. 2 is a diagram showing potentials at various parts at the time of writing into the NAND cell unit shown in FIG. 1.

FIG. 2 is a diagram showing potentials at various parts at the time of programming into the NAND cell unit shown in FIG. 1.

In FIG. 2, the source potential and a gate SGS of a selection gate transistor S1 on the source line side are fixed to 0 V. In other words, the selection gate transistor S1 on the source line side is the off state. Furthermore, FIG. 2 shows a potential in the case which a selected memory cell transistor MC in the NAND memory cell unit is inhibited in programming. In other words, FIG. 2 shows potential relations in the case where programming is inhibited by self boost.

As shown in FIG. 2, a selection gate transistor S2 on the bit line BL side is turned on at time t1.

The potential at the channel of the memory cell transistor MC is raised by raising the potential on the bit line BL at time t2. As a result, the selection gate transistor S2 on the bit line side turns off and the potential on the channel of the memory cell transistor MC is set into the floating state.

If an intermediate voltage Vpass which makes the memory cell transistor MC conductive (which turns on the memory cell transistor MC) is applied to a word line (control gate) WL of an unselected memory cell transistor MC at time t3, then the potential on the channel in the whole NAND cell unit is raised by the boost. In order to raise the boost efficiency, however, a voltage which cuts off a memory cell transistor MC12, for example, 0 V is applied to a control gate line of a memory cell transistor MC12 adjacent to the source line side of the selected memory cell transistor MC.

The potential on channel in the memory cell transistor MC is boosted more when the threshold voltage of the memory cell transistor MC is lower (in a deeper erase state) because of the relation of the transfer potential. Therefore, it is possible to prevent programming error (the memory cell transistor MC inhibited in programming is programmed).

When the erase state of a memory cell transistor MC adjacent to the source line side of the selected memory cell transistor MC is very deep (the threshold voltage of the memory cell transistor MC in the erase state is very low), however, the source side cannot be cut off even if 0 V is applied to the control gate line of the memory cell transistor MC (FIG. 1).

As a result, it is difficult to boost the potential of the channel of the memory cell transistor MC inhibited in programming to a desired potential by self boost. If a write voltage Vpgm is applied to the selected word line WL at time t4, therefore, the electric field between the channel potential and the floating gate becomes strong and negative charges are injected into the floating gate FG of the memory cell transistor MC which is not desired to be programmed into, resulting in programming error.

Figure 3:
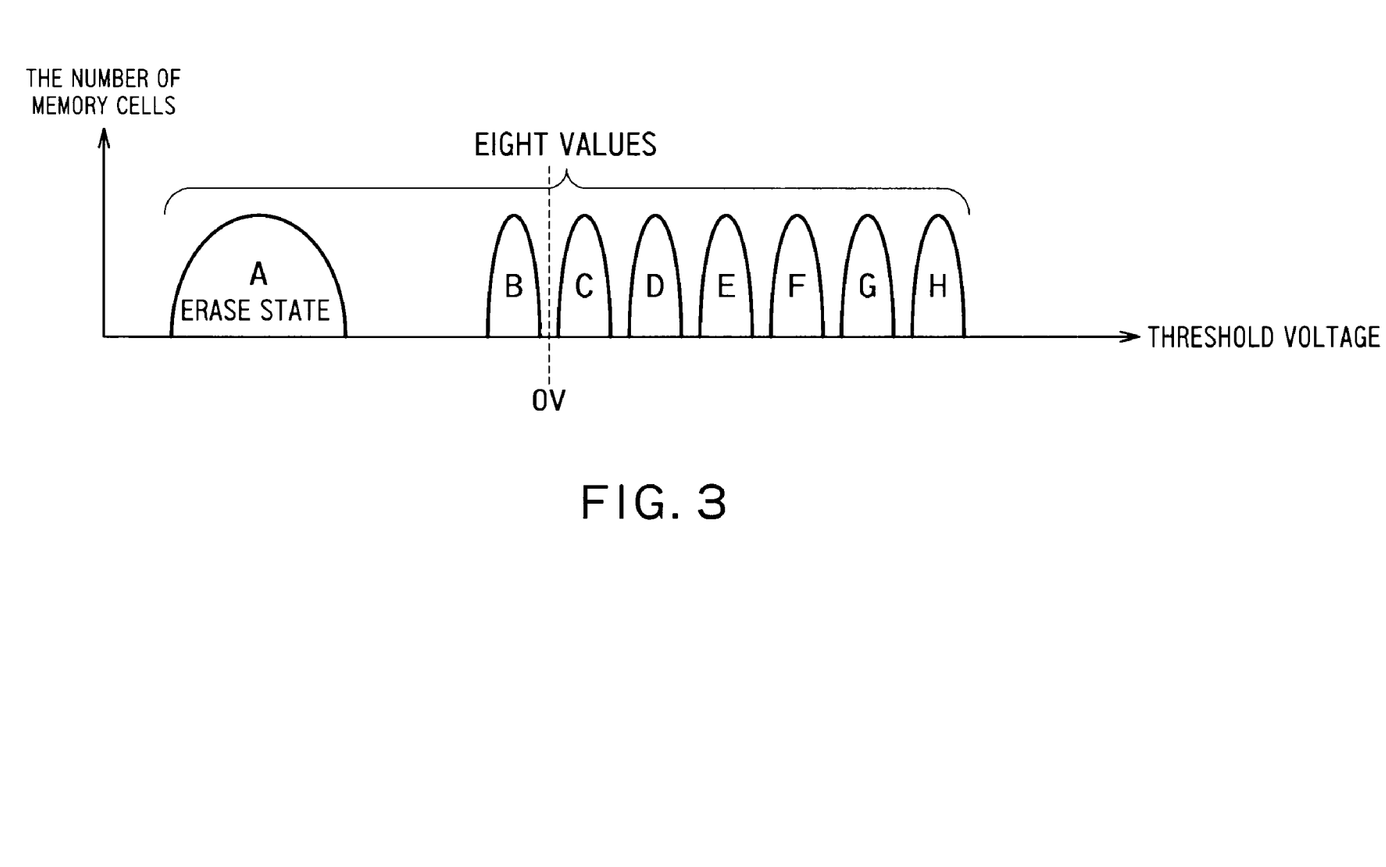
FIG. 3 is a diagram showing an example (the case of eight values) of threshold voltage distribution of memory cell transistors in the conventional NAND flash memory.

FIG. 3 is a diagram showing an example (the case of eight values) of threshold voltage distribution of memory cell transistors in the conventional NAND flash memory. Eight data "A", "B", "C", "D", "E", "F", "G" and "H" are assigned in order from the erase state. In other words, the erase state is also handled as one data.

In recent years, the case where the memory cell transistors are provided with a greater number of state by using negative threshold voltages as shown in FIG. 3. In this case, the erase state tends to become deep (the threshold voltage of the memory cell transistor MC tends to become low) in order to widen the width of the threshold distribution any more.

If the erase state is thus deep, then the channel of the memory cell transistor inhibited in programming (injection of negative charges into the floating gate) cannot be boosted to a desired potential for the above-described reason especially when the memory cell transistor MC adjacent to the source side of the memory cell transistor MC is in the erase state. This results in a problem that programming error into the floating gate FG of the memory cell transistor may occur.

In embodiments according to the present invention, NAND flash memories capable of suppressing programming error into a memory cell transistor more are proposed.

Hereafter, embodiments according to the present invention will be described with reference to the drawings.
(First Embodiment)

Figure 4:
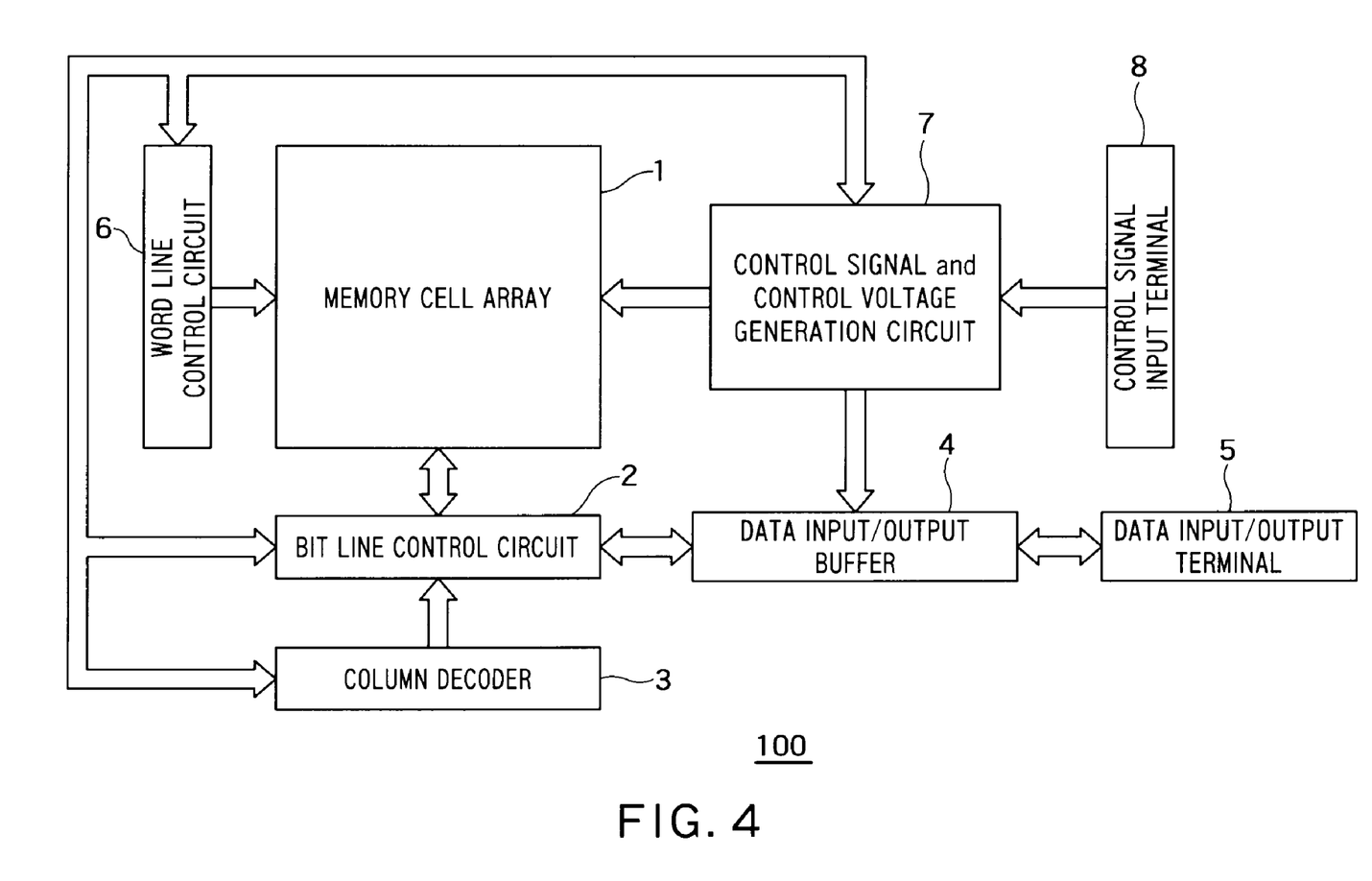
FIG. 4 is a block diagram showing an example of a configuration of a NAND flash memory 100 according to a first embodiment which is an aspect of the present invention.

FIG. 4 is a block diagram showing an example of a configuration of a NAND flash memory 100 according to a first embodiment which is an aspect of the present invention.

A memory cell array 1 shown in FIG. 4 includes a plurality of NAND memory cell units, a plurality of bit lines, a plurality of word lines (control gates), and a source line.

Each of the NAND memory cell units includes a memory cell column formed of a plurality of memory cell transistors connected in series, and selection gate transistors respectively connected to both sides of the memory cell column. The source line is connected in common to the memory cell units.

A bit line control circuit 2 reads out data stored in memory cell transistors via a bit line in the memory cell array 1.

Furthermore, the bit line control circuit 2 detects states of the memory cell transistors via the bit line. The bit line control circuit 2 applies a voltage for conducting writing to the channel of a memory cell transistor via the bit line.

The bit line control circuit 2 includes a plurality of data storage circuits (sense amplifiers). The data storage circuits are provided respectively for columns of the memory cell array 1. Data in a memory cell transistor read out by a data storage circuit which has been selected by a column decoder 3 is read out from a data input/output terminal 5 to the outside via a data input/output buffer 4.

Write data input from the outside to the data input/output terminal 5 is latched in the data storage circuit selected by the column decoder 3, via the data input/output buffer 4 as initial control data. The bit line control circuit 2 controls the voltage applied to the channel of the selected memory cell transistor in the memory cell array 1 via the bit line on the basis of control data in the data storage circuit.

A word line control circuit 6 selects one from among a plurality of word lines (control gates) in the memory cell array 1. And the word line control circuit 6 applies a voltage required for read operation, write operation or erase operation of a memory cell transistor having a selected word line (control gate) to the selected word line (control gate).

Operations of the memory cell array 1, the bit line control circuit 2, the column decoder 3, the data input/output buffer 4 and the word line control circuit 6 are controlled by a control signal and control voltage generation circuit 7.

The control signal and control voltage generation circuit 7 is controlled on the basis of a control signal applied from the outside to a control signal input terminal 8.

Figure 5:
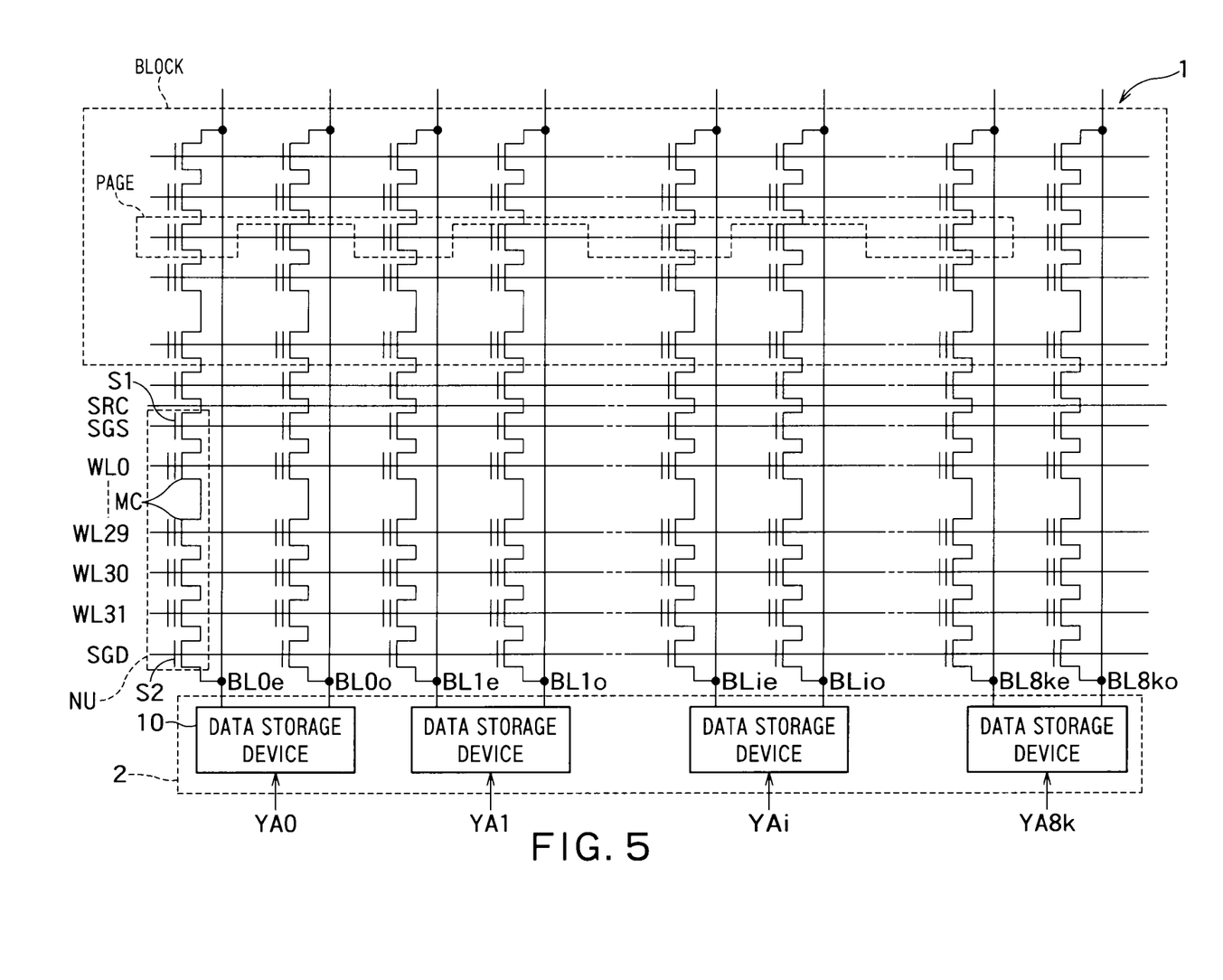
FIG. 5 is a diagram showing configurations of the memory cell array 1 and the bit line control circuit 2 shown in FIG. 4.

FIG. 5 is a diagram showing configurations of the memory cell array 1 and the bit line control circuit 2 shown in FIG. 4.

As shown in FIG. 5, a plurality of NAND cell units NU is arranged in the memory cell array 1. Each of the NAND cell units NU includes for example, thirty-two memory cell transistors MC connected in series, and selection gate transistors S1 and S2.

The selection gate transistor S2 is connected at its first end to a bit line BL0e (BL0o, BL1e, BL1o, . . . , BLie, BLio, . . . , BL8ke, BL8ko). The selection gate transistor S1 is connected at its first end to the source line SRC.

Gates of the selection gate transistor S2 and selection gate transistors adjacent in the row direction (lateral direction in FIG. 5) are connected in common by a selection gate line SGD. Gates of the selection gate transistor S1 and selection gate transistors adjacent in the row direction (lateral direction in FIG. 5) are connected in common by the selection gate line SGS.

A plurality of memory cell transistors MC is connected in series between a second end of the selection gate transistor S1 and a second end of the selection gate transistor S2. Control gates of memory cell transistors arranged in the row direction (lateral direction in FIG. 5) are connected in common to word lines WL0 to WL29, WL30 and WL 31, respectively.

It is possible to write data into a memory cell transistor MC by at least applying a voltage to its control gate to control the charge quantity of the floating gate and change the threshold voltage. This memory cell transistor MC is set to the lowest threshold voltage in the erase state as described later.

The bit line control circuit 2 includes a plurality of data storage circuits 10. One pair of bit lines (BL0e, BL0o), . . . (BLie, BLio) or (BL8ke, BL8ko) are connected to each data storage circuit 10.

As represented by a dashed line, the memory cell array 1 includes a plurality of blocks. Each block is formed of a plurality of NAND cell units NU, and data is erased by taking, for example, a block as the unit. Erase operation is conducted simultaneously on two bit lines connected to the data storage circuit 10.

A plurality of memory cell transistors arranged on alternate bit lines and connected to one word line (memory cell transistors MC in a range surrounded by a dashed line) constitute one page. Data is written and read out page by page.

At the time of read operation, program verify operation and program (writing) operation, one bit line is selected out of two bit lines (BLie, BLio) connected to the data storage circuit 10 in accordance with an address signal (YA0, YA1, . . . , YAi, . . . YA8k) supplied from the outside. In addition, one word line is selected according to an external address.

Figure 6:
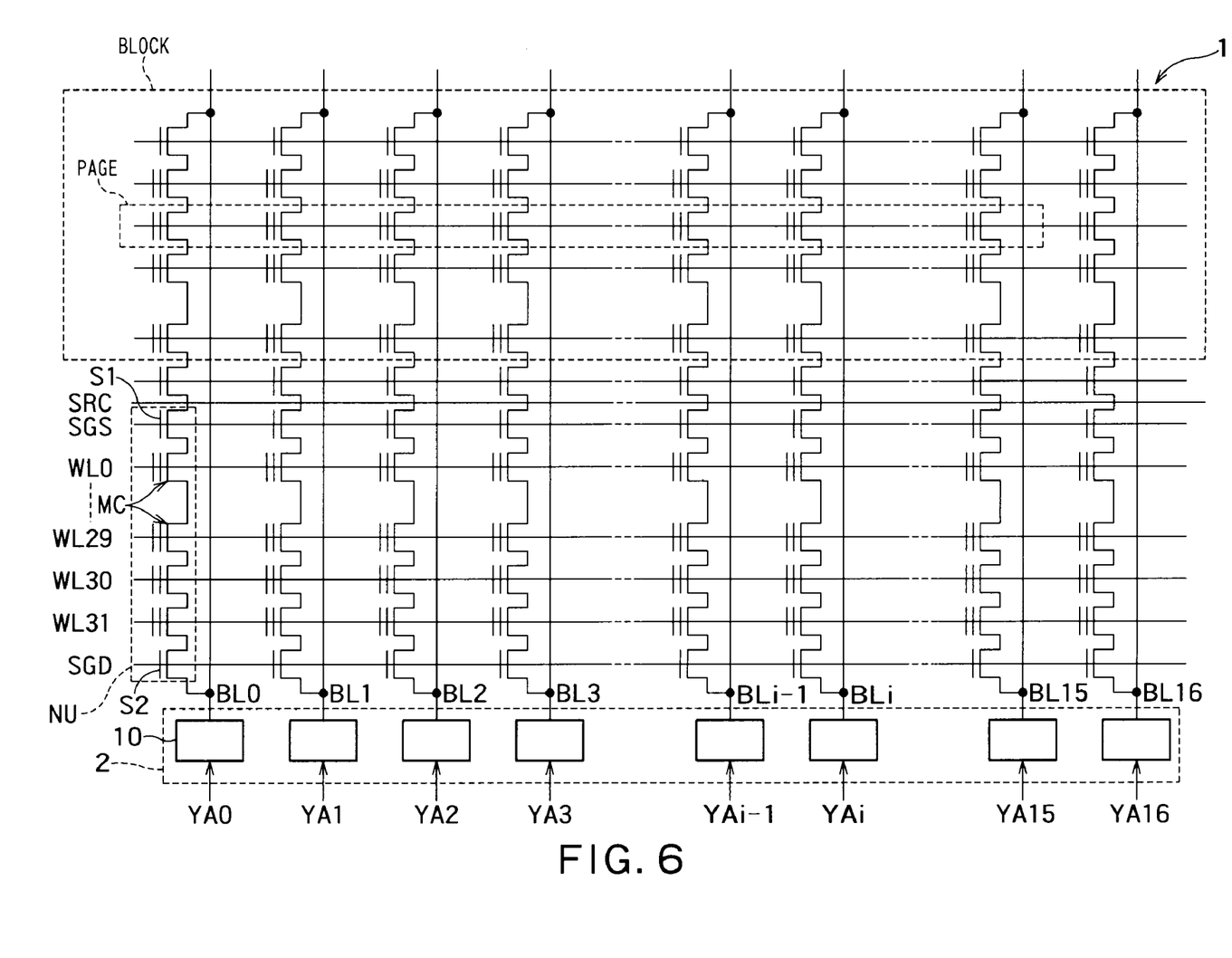
FIG. 6 is a diagram showing another configuration example of the memory cell array 1 and the bit line control circuit 2 shown in FIG. 4.

FIG. 6 is a diagram showing another configuration example of the memory cell array 1 and the bit line control circuit 2 shown in FIG. 4. In FIG. 6, the same reference characters as those in FIG. 5 denote like components shown in FIG. 5.

A configuration in which a data storage circuit 10 is connected to each of bit lines (BL0, BL2, BL3, . . . , BLi-1, BLi, . . . , BL15, BL16) as shown in FIG. 6 may also be used. In this case, memory transistors MC constituting one page are adjacent to each other in the row direction.

At the time of read operation, program verify operation and program (writing) operation, one bit line is selected out of bit lines (BL0, BL2, BL3, . . . , BLi-1, BLi, . . . , BL15, BL16) connected to the data storage circuits 10 in accordance with an address signal (YA0, YA1, . . . , YAi, . . . YA16) supplied from the outside.

Figure 7:
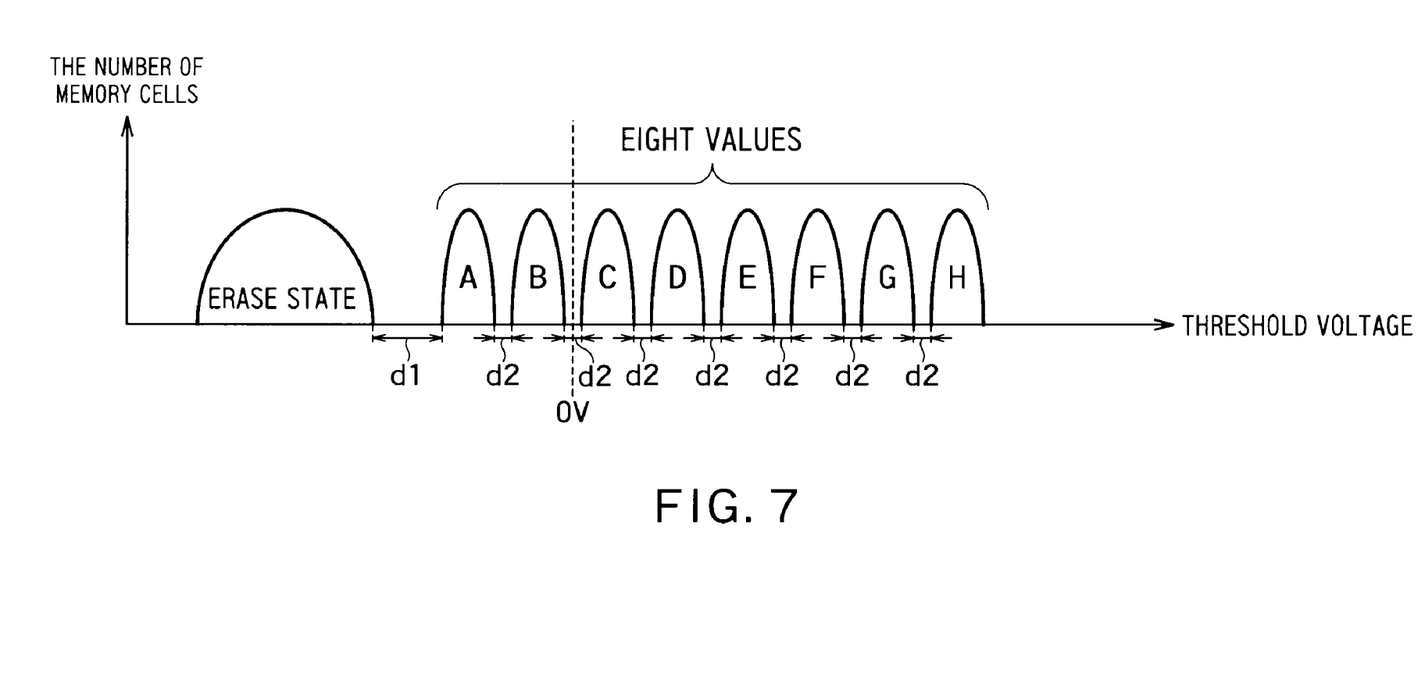
FIG. 7 is a diagram showing an example (the case of eight values) of threshold voltage distribution of memory cell transistors in the NAND flash memory 100 according to the first embodiment.

FIG. 7 is a diagram showing an example (the case of eight values) of threshold voltage distribution of memory cell transistors in the NAND flash memory 100 according to the first embodiment.

As shown in FIG. 7, data is not assigned to the threshold voltage in the erase state (the lowest level). In memory cell transistors in the first embodiment, in addition threshold voltage distribution in the erase state, eight threshold voltage distributions in a programming state in which negative charge has been injected into the floating gate from the erase state. In other words, 9 threshold voltages (N+1 threshold voltages) can be set for the memory cell transistors, and N data are assigned to 8 threshold voltages (N threshold voltages) other than the threshold voltage corresponding to the erase state.

For example, eight data "A", "B", "C", "D", "E", "F", "G" and "H" are assigned in order from a threshold voltage located immediately above the erase state. In other words, the data are assigned to threshold voltages of the memory cell transistor higher than the threshold voltage of that corresponding to the erase state.

In the first embodiment, data are thus assigned to threshold voltages of the memory cell transistor in the programming state which are higher than the threshold voltage of that corresponding to the erase state unlike the comparative example. Therefore, the threshold voltage of a memory cell transistor having data is higher than the threshold voltage corresponding to the erase state. If a programming scheme in which programming is conducted sequentially from the memory cell transistor on the source side is used, then a memory cell transistor MC adjacent to the source line side of the selected memory cell transistor MC has a threshold voltage which is higher than the threshold voltage corresponding to the erase state.

Figure 8:
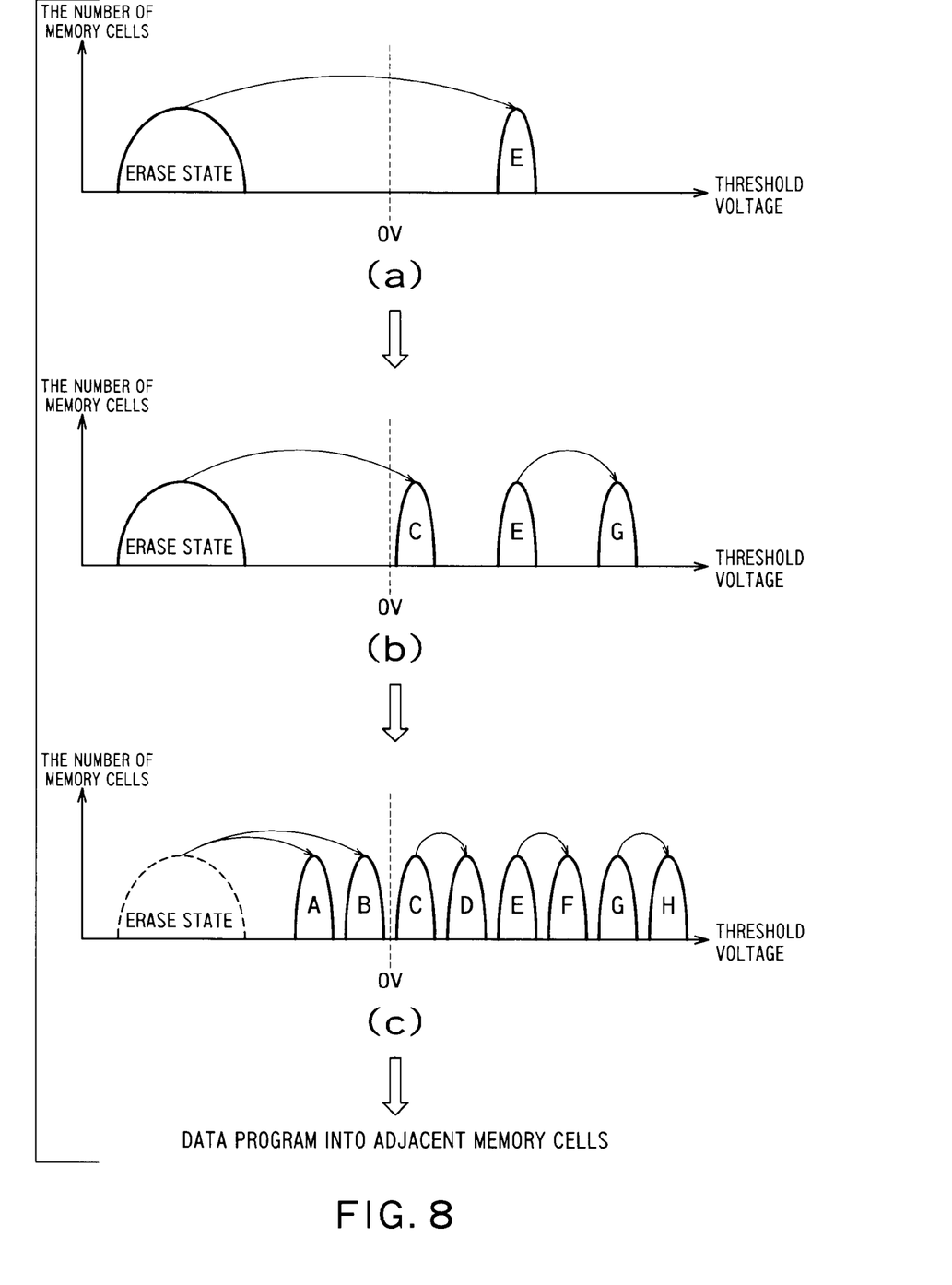
FIG. 8 is a diagram showing an example of a change of a threshold voltage in the write mode of an eight-value NAND flash memory.
Figure 9:
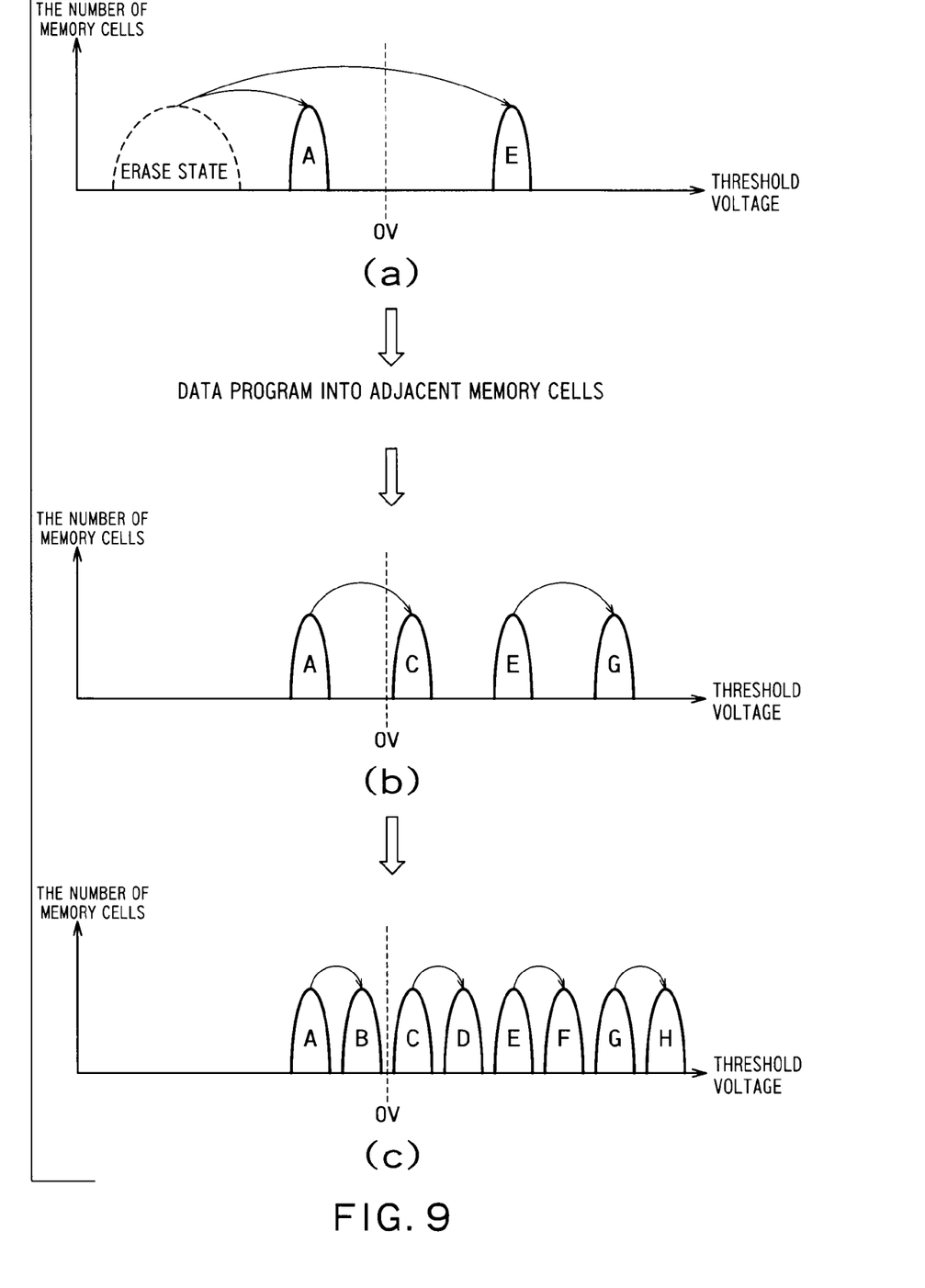
FIG. 9 is a diagram showing another example of the change of the threshold voltage in the write mode of an eight-value NAND flash memory.

FIG. 8 is a diagram showing an example of a change of a threshold voltage in the programming mode of a NAND flash memory having an eight-value data programmed in one memory cell (so-called eight-value NAND flash memory). FIG. 9 is a diagram showing another example of the change of the threshold voltage in the programming mode of an eight-value NAND flash memory.

For example, programming modes of the eight-value NAND flash memory are shown in FIG. 8. This programming is conducted in three stages: low programming shown in FIG. 8(a), middle programming shown in FIG. 8(b), and up programming shown in FIG. 8(c). First, in order to distinguish between data "0" and data "1" in the low programming, the threshold voltage distributions of the erase state and "E" is programmed into memory cells. After the erase state and "E" programmed in the low programming, in order to program data "0" and data "1" in the middle programming. For example, the erase state is bisected to an erase state and "C" by data programmed into the memory cells having the erase state is, and "E" is bisected to "E" and "G" by data programmed the memory cells having "E". After the erase state "C", "E" and "G" programmed in the middle programming, in order to program data "0" and data "1" in the up programming. For example, the erase state is bisected to "A" and "B" by data programmed into the memory cells having the erase state, "C" is bisected to "C" and "D" by data programmed into the memory cells having "C", "E" is bisected to "E" and "F" by data programmed into the memory cells having "E", and "G" is bisected to "G" and "H" by data programmed into the memory cells having "G".

As another write method, it is considered to bisect the erase state in the low programming shown in FIG. 8(a) to "A" and "E" by data programmed into the memory cells as shown in FIG. 9(a). Programming is conducted after the state shown in FIG. 9(a) in the same way as FIG. 8. Middle programming corresponding to FIG. 8(b) is shown in FIG. 9(b), and up programming corresponding to FIG. 8(c) is shown in FIG. 9(c). In other words, it becomes unnecessary to finish all of the low programming, the middle programming and the up programming in one memory cell transistor MC adjacent to source line side of other memory cell transistor MC before data is programmed into other memory cell transistor MC. As a result, data can be programmed into other memory cell transistor MC after the low programming in one memory cell transistor MC. Therefore, interference of the memory cell transistors caused by programming voltage of the adjacent memory cell transistor MC can be reduced.

The above described programming is an example. The effects of the present invention are obtained as long as data is programmed into a memory cell transistor MC which is adjacent to the source line side of the selected memory cell transistor MC.

As shown FIG. 7, a potential difference d1 between distribution width of a threshold voltage corresponding to the erase state and distribution width of a threshold voltage which is lower next to the threshold voltage corresponding to the erase state is greater than a potential difference d2 in distribution width between adjacent threshold voltages other than the threshold voltage corresponding to the erase state. In this way, the threshold voltage corresponding to the erase state is set very low as compared with threshold voltages assigned data. Because the memory cell transistor MC adjacent to the source line side of the selected memory cell transistor MC does not become lower than that of the erase state. Then, the threshold of the erase state can be made lower as compared with the conventional art. Furthermore, since data is not assigned to the erase state, the distribution width of the threshold voltage can be set to be wider than the distribution widths of other threshold voltages.

Figure 10:
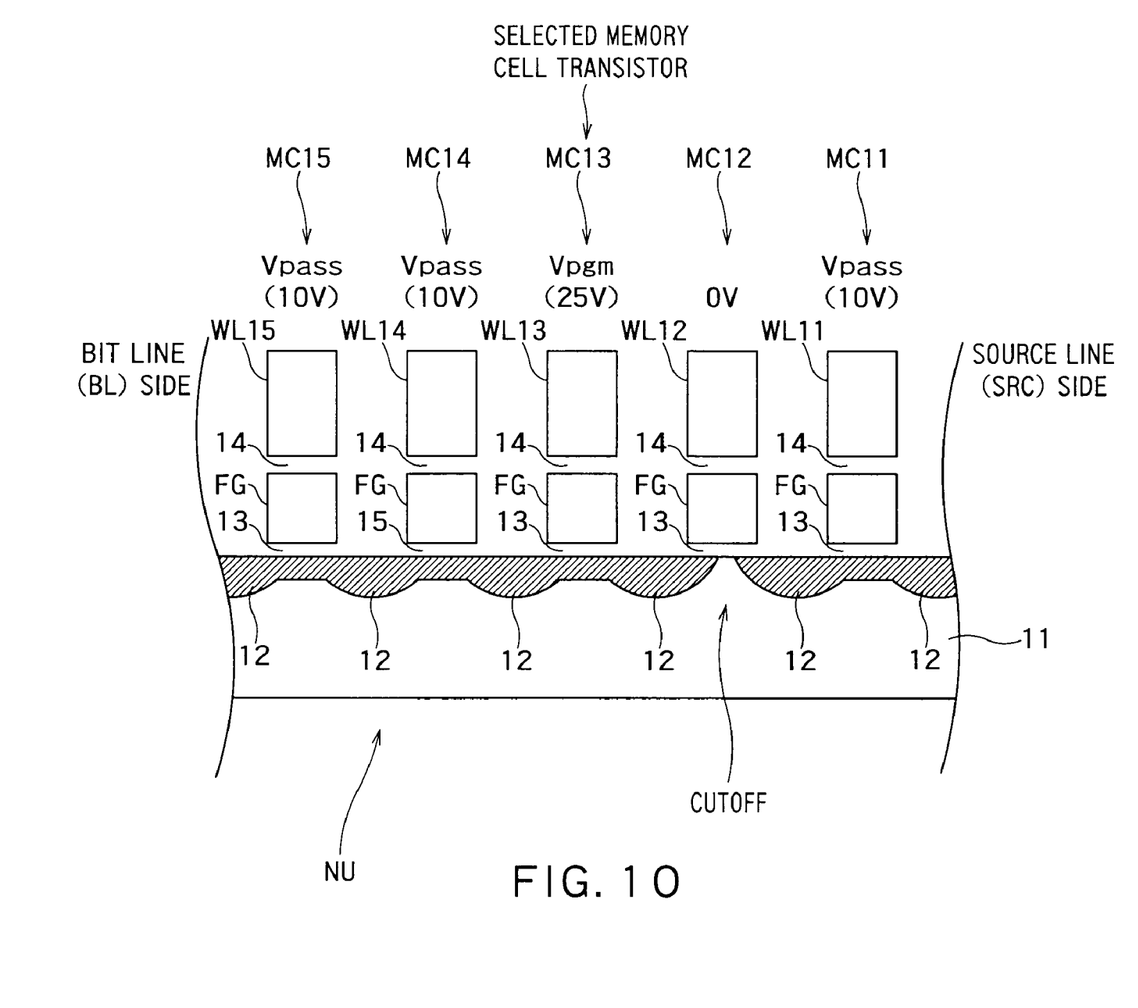
FIG. 10 is a sectional view showing a partial section of NAND cell units in the memory cell arrays 1 shown in FIGS. 5 and 6.
Figure 11:
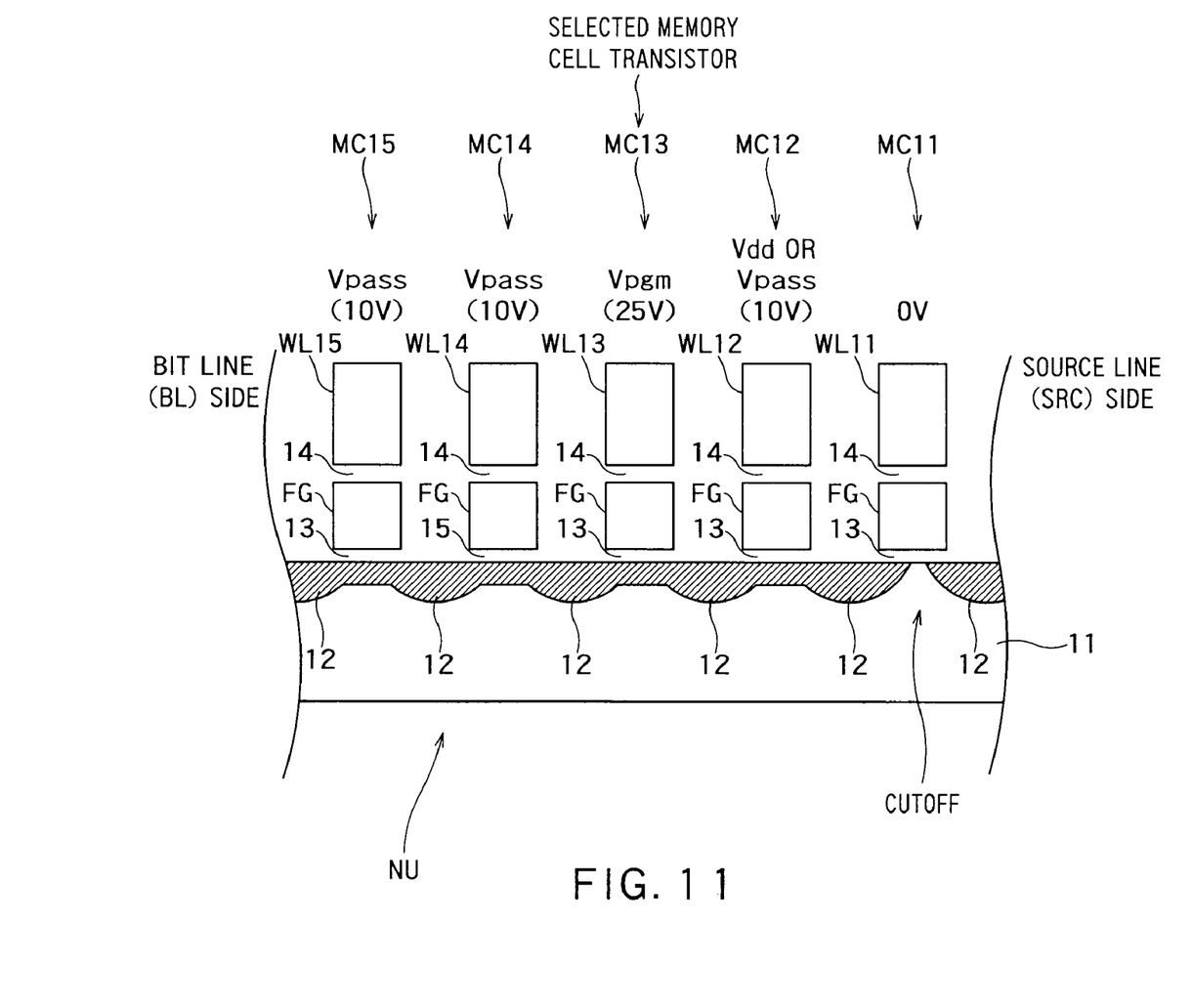
FIG. 11 is a sectional view showing a partial section of NAND cell units in the memory cell arrays 1 shown in FIGS. 5 and 6.
Figure 12:
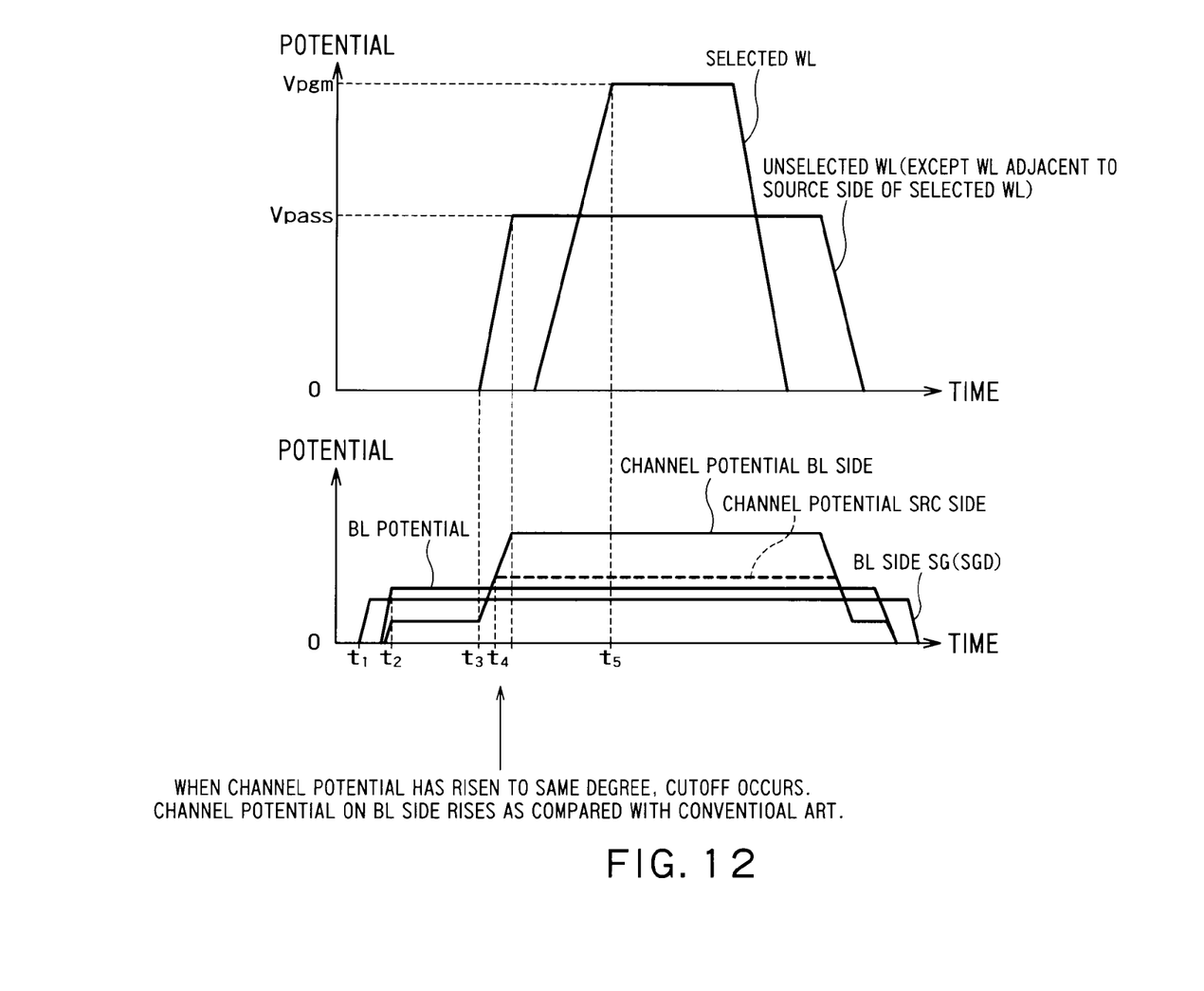
FIG. 12 is a diagram showing potentials at various parts at the time of writing into a NAND cell unit in the memory cell array 1 shown in FIGS. 5 and 6.

FIGS. 10 and 11 are sectional views showing partial sections of NAND cell units in the memory cell arrays 1 shown in FIGS. 5 and 6, respectively. In FIGS. 10 and 11, the left side is the bit line contact (drain) BL side and the right side is the source line contact (source) SRC side. FIG. 12 is a diagram showing potentials at various parts at the time of programming into a NAND cell unit in the memory cell array 1 shown in FIGS. 5 and 6.

The NAND cell unit NU includes a memory cell column formed of a plurality of memory cell transistors MC connected in series, and selection gate transistors S1 and S2 respectively connected to both sides of the memory cell column (FIGS. 5, 6 and 10).

As shown in FIG. 10, a memory cell transistor MC includes a diffusion layer 12 formed in a semiconductor substrate 11, a floating gate FG formed over the semiconductor substrate 11 via a tunnel insulation film 13, and a control gate (a word line WL) formed over the floating gate FG via an insulation film 14.

Supposing that a memory cell transistor MC13 is selected, an example of programming operation conducted according to the programming scheme already described will now be described. It is now supposed that a memory cell unit NU including the memory cell transistor MC13 is inhibited in programming by self boost.

At the time of this programming operation, programming is conducted sequentially beginning with the memory cell transistor from the source line side. Therefore, a memory cell transistor MC11 (as well as all memory cell transistors located on the source line side as compared with the memory cell transistor MC11) is in a programming completion state (a state in which the threshold voltage is higher as compared with the erase state).

In addition, a memory cell transistor MC12, which is adjacent on the source line side to the selected memory cell transistor MC13 and supplied with, for example, 0 V at its control gate (word line WL12) in order to cut off the source line side, is in the programming completion state (the state in which the threshold voltage is higher as compared with the erase state).

Memory cell transistors MC14 and MC15 located on the bit line side as compared with the memory cell transistor MC12 are not subject to programming and are in the erase state.

A source potential and a gate SGS of a selection gate transistor S1 on the source line side are fixed to 0 V. As a result, a source line SRC and memory cell transistors MC are in the electrical cutoff state.

Supposing that the memory cell transistor MC13 is selected, another example of programming operation conducted according to the programming scheme already described will now be described (FIG. 11).

The example shown in FIG. 11 differs from the example shown in FIG. 10 is that the memory cell transistor MC12 is not cut off but the memory cell transistor MC11 is cut off. Here, a power supply voltage (Vdd) or Vpass is applied to the memory cell transistor MC12. In other words, the example shown in FIG. 11 differs from the example shown in FIG. 10 is that a memory cell transistor MC on the source line side adjacent to the selected memory cell transistor MC with one memory cell transistor MC between is cut off.

As a result, the memory cell transistor MC12 adjacent to the memory cell transistor MC13 becomes high in voltage, and consequently the potential at the channel in the memory cell transistor MC13 is raised. In FIG. 11, an inversion layer is formed in the channel of the memory cell transistor MC12 and is connected source and drain of the memory cell transistor MC12. In some cases, however, the inversion layer is not formed depending upon the quantity of charge stored in the memory cell transistor MC12.

Furthermore, a memory cell transistor MC on the source line side which is adjacent to the selected memory cell transistor MC with at least two memory cell transistors MC between may be cut off.

Potentials at various parts at the time of programming into the NAND cell unit as shown in FIGS. 7, 10 and 11 are shown in FIG. 12.

First, the potential on the selection gate line SGD is raised to turn on the selection gate transistor S2 on the bit line BL side (time t1).

Subsequently, the potential at the channel in every memory cell transistor MC is raised by raising the potential on the bit line BL (time t2). As a result, the selection gate transistor S2 on the drain side turns off, and the channel is brought into the floating state. By the way, when it is desired to program data into the memory cell transistor MC13, the voltage on the bit line BL is set equal to 0 V. By doing so, the memory cell transistor MC on the drain side does not turn off, resulting in strong electric field between the channel potential and the floating gate, and negative charge is injected into the memory cell transistor MC13.

Subsequently, the memory cell transistor MC12 connected to the source line side of the selected memory cell transistor MC13 among the memory cell transistors MC is brought into a state in which a voltage Vcut is applied to its control gate (word line WL). The Vcut is a voltage for cutting off the memory cell transistor MC12, and it is, for example, 0 V.

By the way, it suffices that the voltage Vcut can cut off the memory cell transistor MC12 (the memory cell transistor MC11 in the example shown in FIG. 11, hereafter these memory cell transistors are collectively referred to as "the memory cell transistor MC12 or the like"), and it suffices that the voltage Vcut is at least lower than Vpass. Furthermore, it is likable to set the voltage Vcut equal to or higher than 0 V. As a result, it becomes unnecessary to generate a negative voltage, and an increase of the circuit area of the control signal and control voltage generation circuit 7 can be avoided.

In the above-described state, an intermediate voltage Vpass (for example, 10 V) which is higher than the voltage Vcut. And, a plurality of memory cell transistors that is unselected is turn on by applying Vpass to control gates (word lines) WL11, WL14 and WL15 of the unselected memory cell transistors MC11, MC14, and MC15. In the example shown in FIG. 11, Vdd or Vpass is applied to the memory cell transistor MC12. The intermediate voltage Vpass is applied to control gates (word lines) WL of unselected memory cell transistors MC which are not shown in FIG. 10 in the same way. As a result, channels of respective memory cell transistors MC are boosted.

When the potential on the channel has risen to some degree, the memory cell transistor MC12 or the like which is adjacent on the source side to the selected memory cell transistor MC13 cuts off (conduction between the memory cell transistor MC11 and the memory cell transistor MC13 is electrically cut off, or in the example shown in FIG. 11, conduction between the memory cell transistor MC12 and the diffusion layer on the source line side of the memory cell transistor MC11 is electrically cut off) (time t4).

By the way, the threshold voltage of the memory cell transistor MC12 or the like for bringing about cutoff depends upon the threshold voltage in the programming state. As the threshold voltage becomes higher, cutoff can be brought about with a lower channel voltage. In other words, the memory cell transistor MC12 or the like can be cut off on the source side more certainly as compared with the comparative example.

As a result, the potential rise on the channel located on the source line side when viewed from the memory cell transistor MC12 or the like is stopped. This is because the memory cell transistor on the source line side is in the programming state (a state in which more charges are injected into the floating gate as compared with the erase state) as already described.

On the other hand, the potential on the channel located on the bit line side when viewed from the memory cell transistor MC12 or the like further rises. This is because the memory cell transistor on the bit line side is in the erase state which is lower in threshold voltage than the programming state in which data is assigned as already described.

In the programming scheme sequentially programming the memory cell transistor from the source line side, the channel on the drain side of the memory cell transistor MC12 or the like to be cut off can be thus boosted more efficiently.

Thereafter, a voltage Vpgm (for example, 25 V) which is higher than the voltage Vpass is applied to the control gate of the selected memory cell transistor MC13 to program (time t5). As a result, injection of negative charge into the memory cell transistor MC13 is prevented, and the threshold voltage of a memory cell transistor MC connected to the memory cell transistor MC13 in common at control gates. So a threshold voltage of a memory cell transistor to be subjected programming is higher than the threshold voltage corresponding to the erase state.

As already described, the channel on the bit line side of the memory cell transistor MC12 or the like to be cut off can be boosted more efficiently. Therefore, it is possible to prevent more negative charges being injected into the floating gate FG of the memory cell transistor MC13 supplied with the programming voltage Vpgm at its control gate (word line WL13).

In other words, it is possible to prevent a threshold voltage higher than a desired threshold voltage of the memory cell transistor MC13 having already programmed erroneously.

In the NAND flash memory according to the present embodiment, programming error of a memory cell transistor can be further suppressed as heretofore described.

In the embodiment, the case where the memory cell transistors store eight-value multi-valued data has been described. However, the embodiment can also be applied to the case where multi-valued data such as sixteen-value data is stored.

Furthermore, in the embodiment, a memory cell transistor which is adjacent on the source line side to the selected memory cell transistor is used for cutting off. However, a memory cell transistor which is adjacent on the source line side to the selected memory cell transistor with at least one memory cell transistor may also be used as the memory cell transistor for cutting off.

What is claimed is:

1. A NAND flash memory using a programming scheme programming a memory cell transistor from a source line side, the NAND flash memory comprising:
a first selection gate transistor comprising a first end connected to a source line;

a second selection gate transistor comprising a first end connected to a bit line; and a plurality of memory cell transistors connected in series between a second end of the first selection gate transistor and a second end of the second selection gate transistor, data being able to be programmed into each of the plurality of the memory cell transistors by applying a voltage to a control gate thereof, controlling a charge quantity of a floating gate thereof, and changing a threshold voltage, and in an erase state each of the memory cell transistors being set equal to a first threshold voltage being the lowest threshold voltage, wherein the data are assigned to threshold voltages which are higher than the first threshold voltage corresponding to the erase state, N+1 threshold voltages are set for the memory cell transistors, N data are assigned to N threshold voltages other than the first threshold voltage corresponding to the erase state, and a first programming is conducted, as regards a threshold voltage of one memory cell transistor included in the plurality of the memory cell transistors, by setting one data of two-valued data to a second threshold voltage which is lower next to the first threshold voltage and setting the other data of the two-valued data to a third threshold voltage which is higher than the second threshold voltage.

2. The NAND flash memory according to claim 1, wherein before data programmed into the first memory cell transistor selected from among the plurality of the memory cell transistors, the first programming is conducted on a second memory cell transistor which is included in the plurality of the memory cell transistors and which is adjacent to the first selection gate transistor side of the first memory cell transistor.

3. The NAND flash memory according to claim 1, wherein, after the first programming is conducted on a second memory cell transistor which is adjacent to the first selection gate transistor side of the first memory cell transistor selected from among the plurality of the memory cell transistors, data is further programmed into the second memory cell transistor.

4. The NAND flash memory according to claim 2, wherein, after the first programming is conducted on a second memory cell transistor which is adjacent to the first selection gate transistor side of the first memory cell transistor selected from among the plurality of the memory cell transistors, data is further programmed into the second memory cell transistor.

5. The NAND flash memory according to claim 1, wherein, before the first programming is conducted on a second memory cell transistor which is adjacent to the first selection gate transistor side of the first memory cell transistor selected from among the plurality of the memory cell transistors, data is programmed into the second memory cell transistor.

* * * * *